United States Patent
Lee et al.

(10) Patent No.: US 8,451,362 B2
(45) Date of Patent: May 28, 2013

(54) IMAGE SENSOR WITH A LIGHT RECEIVING REGION AND A RECESSED CHARGE TRANSMISSION UNIT AND IMAGE SENSING SYSTEM INCLUDING THE SAME

(75) Inventors: Yong Jei Lee, Seongnam-si (KR); Jung Chak Ahn, Yongin-si (KR); Jong Eun Park, Seongnam-si (KR); Dong-Yoon Jang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 357 days.

(21) Appl. No.: 12/461,608

(22) Filed: Aug. 18, 2009

(65) Prior Publication Data
US 2010/0045836 A1 Feb. 25, 2010

(30) Foreign Application Priority Data
Aug. 20, 2008 (KR) .......................... 10-2008-0081105

(51) Int. Cl.
*H04N 3/14* (2006.01)
*H04N 5/335* (2011.01)
*H01L 31/062* (2012.01)
*H01L 31/113* (2006.01)

(52) U.S. Cl.
USPC ............................ 348/309; 348/308; 257/291

(58) Field of Classification Search
USPC ............ 348/294, 302, 307–309; 257/291–292
See application file for complete search history.

(56) References Cited

U.S. PATENT DOCUMENTS

| | | | | |
|---|---|---|---|---|
| 6,433,373 | B1* | 8/2002 | Lee et al. | 257/292 |
| 7,217,968 | B2* | 5/2007 | Adkisson et al. | 257/292 |
| 7,588,956 | B2* | 9/2009 | Lim | 438/48 |
| 2004/0262494 | A1* | 12/2004 | Egawa et al. | 250/208.1 |
| 2006/0208285 | A1 | 9/2006 | Inoue et al. | |
| 2008/0001192 | A1 | 1/2008 | Inoue et al. | |
| 2008/0121952 | A1* | 5/2008 | Chu | 257/292 |
| 2008/0153193 | A1* | 6/2008 | Lyu | 438/59 |
| 2008/0277693 | A1* | 11/2008 | Mauritzson et al. | 257/205 |

FOREIGN PATENT DOCUMENTS

| | | |
|---|---|---|
| JP | 2006-261411 A | 9/2006 |
| KR | 10-2006-0101187 A | 9/2006 |
| KR | 10-2007-0102602 A | 10/2007 |

* cited by examiner

*Primary Examiner* — Daniel M Pasiewicz
(74) *Attorney, Agent, or Firm* — Lee & Morse, P.C.

(57) ABSTRACT

An image sensor includes a conductive well in a semiconductor substrate, a photo sensitive device (PSD) in the semiconductor substrate below the conductive well, the PSD and conductive well overlapping each other, and a charge transmission unit in the semiconductor substrate and adjacent to the conductive well, the charge transmission unit having a structure of a recessed gate and being positioned in a recess region of the semiconductor substrate.

20 Claims, 6 Drawing Sheets

IMAGE SENSOR WITH A LIGHT RECEIVING REGION AND A RECESSED CHARGE TRANSMISSION UNIT AND IMAGE SENSING SYSTEM INCLUDING THE SAME

BACKGROUND

1. Field

Example embodiments relate to an image pick-up device. More particularly, example embodiments relate to an image sensor capable of securing saturation electrons and an image sensing system including the image sensor.

2. Description of the Related Art

Image sensors are semiconductor devices that convert an optical image into an electrical signal, and may be roughly classified into charge coupled device (CCD) image sensors and CMOS image sensors (CISs).

A conventional CIS may include a photo sensitive device (PSD) in order to sense an image for each unit pixel. For example, a unit pixel may include a PSD and transistors for transmitting a signal sensed by the PSD, e.g., a transfer transistor, a reset transistor, a drive transistor, etc.

However, a decrease in a size of an image sensor may decrease sensitivity of the image sensors, so it may be difficult to secure saturation electrons. For example, as a size of a unit pixel of an image sensor decreases, an absolute area of a PSD in the unit pixel, e.g., an area of a PSD of each unit pixel, may decrease. The decrease of the area of the PSD may decrease the sensitivity of the image sensor and the saturation electrons. This may lead, e.g., to degradation of the quality of image of the image sensor.

SUMMARY

Embodiments are therefore directed to an image sensor and an image sensing system including the same, which substantially overcome one or more of the problems due to the limitations and disadvantages of the related art.

It is therefore a feature of an embodiment to provide an image sensor with a structure capable of securing saturation electrons.

It is therefore another feature of an embodiment to provide an image sensing system including an image sensor with a structure capable of securing saturation electrons.

At least one of the above and other features and advantages may be realized by providing an image sensor, including a conductive well formed within a semiconductor substrate, a PSD formed below the conductive well so as to face the conductive well, and a charge transmission unit formed within the semiconductor substrate so as to be adjacent to one side of the conductive well, wherein the charge transmission unit has a structure of a recessed gate formed in a recess region of the semiconductor substrate.

The image sensor may further include a charge detection unit adjacent to the charge transmission unit and adapted to detect a sensing signal received from the PSD via the charge transmission unit. The charge transmission unit may be between the charge detection unit and the conductive well. The PSD and the conductive well may be aligned along a vertical direction extending along a normal to the semiconductor substrate. The charge transmission unit may extend to a predetermined depth in the semiconductor substrate and may overlap a lateral side of the conductive well. The PSD and the conductive well may be spaced apart from each other by a predetermined distance, the predetermined distance being measured along a direction normal to the semiconductor substrate. The PSD and the conductive well may be completely separated from each other by a portion of the semiconductor substrate. The predetermined distance between the PSD and the conductive well may be about 0.5 μm to about 1 μm. The image sensor may further include at least one drive transistor on the conductive well, the conductive well being between the drive transistor and the PSD. The image sensor may further comprising a ground line in the conductive well.

At least one of the above and other features and advantages may also be realized by providing an image sensor, including a first conductive well formed within a semiconductor substrate, a first PSD formed below the first conductive well so as to face the first conductive well, a second conductive well formed within the semiconductor substrate so as to be apart from the first conductive well, a second PSD formed below the second conductive well so as to face the second conductive well, a first charge transmission unit formed within the semiconductor substrate so as to be adjacent to one side of the first conductive well, and a second charge transmission unit formed within the semiconductor substrate so as to be adjacent to one side of the second conductive well and to face the first charge transmission unit.

At least one of the first and second charge transmission units may have the structure of the recessed gate positioned in the recess region of the semiconductor substrate. The charge detection unit may be between the first and second charge transmission units. At least one of the first and second PSDs may be spaced apart from a respective first or second conductive well by a predetermined distance, the predetermined distance being measured along a direction normal to the semiconductor substrate. The predetermined distance may be about 0.5 μm to about 1 μm. The image sensor may further include at least one ground line in each of the first and second conductive wells.

At least one of the above and other features and advantages may also be realized by providing an image sensor, including an active pixel sensor (APS) array which senses light and generates an image signal, and an analog-to-digital converter (ADC) which samples the image signal and converts the image signal into a digital signal, wherein a unit pixel of the APS array includes a conductive well formed within the semiconductor substrate, and an PSD formed below the conductive well so as to face the conductive well.

At least one of the above and other features and advantages may also be realized by providing an image sensing system, including an image sensor which senses light, generates an image signal, and includes an APS array and an ADC, a central processing unit (CPU) which controls an operation of the image sensor, and a memory which stores the image signal generated by the image sensor which is controlled by the CPU.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
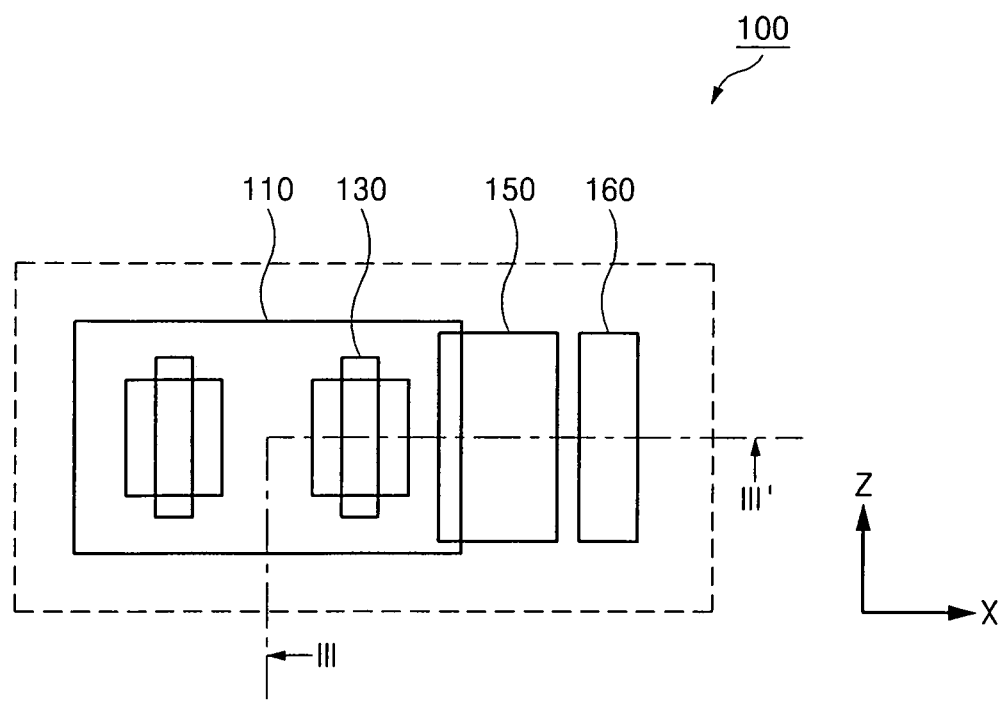
FIG. 1 illustrates a schematic layout of a unit pixel of an image sensor according to an embodiment.

Korean Patent Application No. 10-2008-0081105, filed on Aug. 20, 2008, in the Korean Intellectual Property Office, and entitled: "Image Sensor and Image Sensing System Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers and/or elements may also be present. Further, it will be understood that when a layer or element is referred to as being "below" another layer or element, it can be directly below, or one or more intervening layers and/or elements may also be present. In addition, it will also be understood that when a layer or element is referred to as being "between" two layers and/or elements, it can be the only layer between the two layers and/or elements, or one or more intervening layers and/or elements may also be present. Like reference numerals refer to like elements throughout.

Examples of image sensors according to embodiments may include, e.g., a charge coupled device (CCD) image sensor and/or a CMOS image sensor (CIS). CCD image sensors may generate low noise and may provide good-quality images, as compared with CISs, but may require high voltages and may be manufactured at high costs. CISs may be simply driven and may be implemented in various scanning manners. Signal processing circuits of CISs may be integrated in a single chip, and thus CISs may be made compact. CISs may be manufactured by compatibly using a CMOS manufacturing process, and thus manufacturing costs thereof may be reduced. CISs may consume very low power and thus may be easily applied to products that use restricted batteries. Accordingly, an image sensor according to example embodiments will now be described with reference to a CIS, as an example. However, the inventive concept may also be applied to other type of image sensors, e.g., CCD image sensors.

Figure 2:
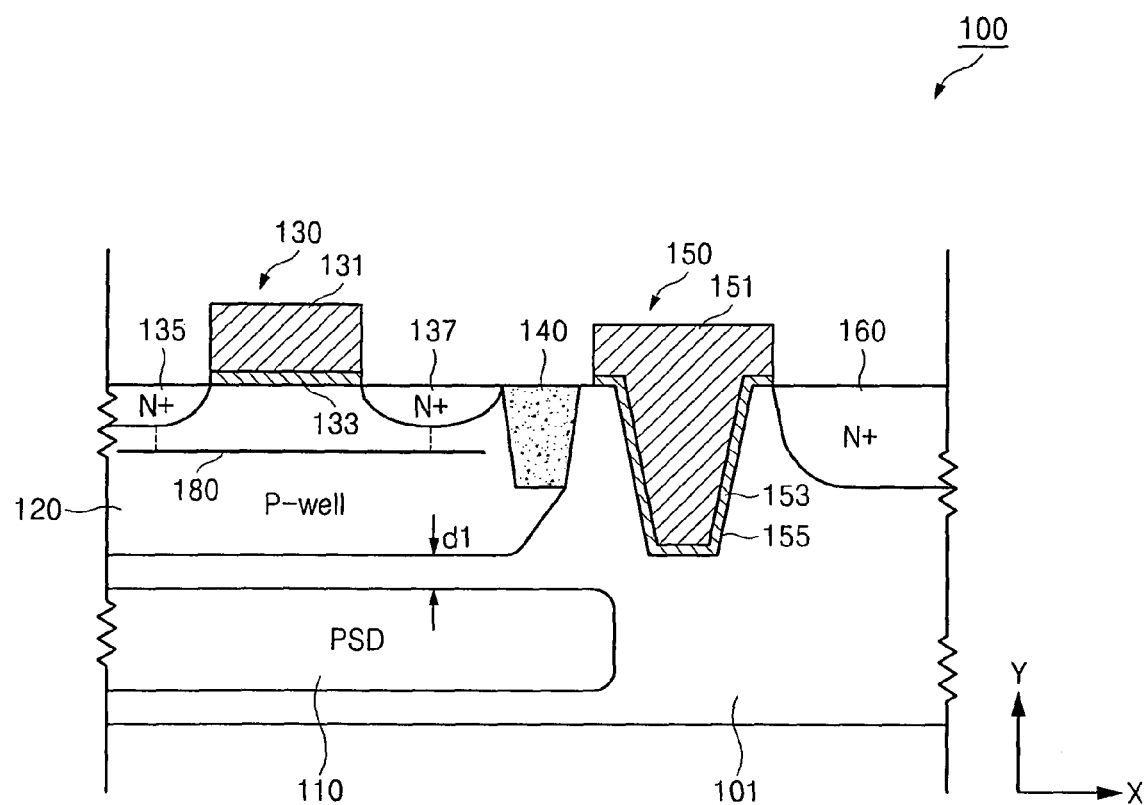
FIG. 2 illustrates a cross-section of the unit pixel in FIG. 1 along line III~III' of FIG. 1.

FIG. 1 illustrates a schematic layout of a unit pixel 100 of an image sensor according to an embodiment. FIG. 2 illustrates a cross-section of the unit pixel 100 along line III~III' of FIG. 1. Referring to FIGS. 1 and 2, the unit pixel 100 may include a circuit region, e.g., a transistor on a conductive well, and a light receiving region, e.g., at least on the PSD, that may be arranged along a substantially vertical line.

For example, the circuit (or active) region of the unit pixel 100 may include at least one driving transistor, e.g., a drive transistor 130, and a charge transmission unit 150 formed on a semiconductor substrate 101. In another example, the unit pixel 100 may include at least three driving transistors, e.g., a transfer transistor that forms the charge transmission unit 150 and two drive transistors 130 that serve as a source follower buffer amplifier. However, example embodiments are not limited to the above.

For example, the unit pixel 100 of the image sensor may include the transfer transistor that forms the charge transmission unit 150 for transmitting charge to a floating diffusion (FD) region, i.e., a charge detection unit 160, a reset transistor for periodically resetting charge stored in the FD region, a drive transistor that serves as a source follower buffer amplifier and buffers a signal that depends on the charge stored in the FD region, and a select transistor that performs switching and addressing in order to select a unit pixel.

A conductive well 120 may be formed in a shallow region of the semiconductor substrate 101, e.g., a region having a depth of about 0.5 μm to about 1 μm from an upper surface of the semiconductor substrate 101. The conductive well 120 may form a conduction path within the semiconductor substrate 101. For example, in the present embodiment, the conductive well 120 may be a p-type conductive well. The semiconductor substrate 101 may be, e.g., a silicon (Si) substrate.

The conductive well 120 may have a 2-layer structure. For example, the conductive well 120 may be formed by forming a first well, i.e., a deep p-type well, within the semiconductor substrate 101. Next, a second conductive well, e.g., a p-type well into which p-type impurity ions have been injected, may be formed on the first well, i.e., on the deep p-type well. The p-type impurity ions may be, e.g., boron (B) or boron fluoride ($BF_2$).

An isolation region 140 that defines an active region may be formed within the conductive well 120. The isolation region 140 may be formed, e.g., by shallow trench isolation (STI), by Local Oxidation of Silicon (LOCOS), etc. Although not shown in FIG. 2, the isolation region 140 may be surrounded by a channel stop region. The channel stop region may be a p-type impurity-injected region.

At least one driving transistor serving as a source follower buffer amplifier, e.g., the drive transistor 130, may be formed on the conductive well 120, i.e., on the upper surface of the semiconductor substrate 101. The drive transistor 130 may be, e.g., a MOS transistor. The drive transistor 130 formed on the upper surface of the semiconductor substrate 101 may include a gate insulation film 133 and a gate electrode 131. The gate insulation film 133 may be formed on the conductive well 120 of, e.g., one or more of Si oxide and Si nitride. The gate electrode 131 may be formed on the gate insulation film 133 of, e.g., polysilicon, tungsten (W), titanium nitride (TiN), tantalum (Ta), tantalum nitride (TaN), or any mixture thereof.

A source region 135 and a drain region 137 of the drive transistor 130 may be formed in the conductive well 120 on both sides of the gate electrode 131, respectively. The source region 135 and the drain region 137 may be formed by injecting impurities to a predetermined depth into the conductive well 120. For example, the source region 135 and the drain region 137 may be formed by injecting, e.g., substantially vertically, N+ type impurity ions, e.g., phosphorus (P) ions, into the conductive well 120, so the gate electrode 131 of the drive transistor 130 may be between the source region 135 and the drain region 137.

A ground line 180 may be formed within the conductive well 120. The ground line 180 may prevent or substantially minimize electrical influence of charge leaking from a PSD 110 on the conductive well 120. For example, the ground line of the conductive well 120 may be formed adjacent to one of the source region 135 and the drain region 137 of the drive transistor 130 and may be connected to an external ground line. Although not shown in FIG. 2, before the source region 135 and the drain region 137 are formed, a gate spacer may be formed on sidewalls of the gate electrode 131.

The light receiving region of the unit pixel 100 may be formed below the conductive well 120, e.g., within a region that is deeper than the conductive well 120 along the y-axis relative to the upper surface of the semiconductor substrate 101. For example, the conductive well 120 may be between the light receiving region and the upper surface of the semiconductor substrate 101. For example, the light receiving region may be formed within a region having a depth, e.g., along the y-axis, of about 1.5 μm to about 2 μm from the upper surface of the semiconductor substrate 101. The light receiving region and the conductive well 120 may be arranged vertically, e.g., aligned along the y-axis, with respect to each other. A width of the light receiving region, e.g., along the x-axis and/or along the z-axis, may be substantially equal to or wider than a width of the conductive well 120, e.g., along the x-axis and/or along the z-axis. For example, the light receiving region may overlap, e.g., completely overlap, the conductive well 120. The light receiving region may include the PSD 110, so the PSD 110 may be below the conductive well 120, e.g., the PSD 110 and the conductive well 120 may be vertically aligned along the y-axis. For example, the PSD 110 and the conductive well 120 may face each other, e.g., overlap each other. For example, the PSD 110 and the conductive well 120 may be substantially parallel to each other.

The PSD 110 may be a photoelectric conversion device that receives light from an external source, e.g., through a lower surface of the semiconductor substrate 101, and generates light charge corresponding to the received light. The lower surface of the semiconductor substrate 101 may be opposite the upper surface thereof, so the PSD 110 may be between the lower surface of the semiconductor substrate 101 and the conductive well 120. The PSD 110 may be, e.g., a photo diode, a photo transistor, a photo gate, a pinned photo diode, any combination thereof, etc.

The PSD 110 may be formed by injecting high-energy ions into the semiconductor substrate 101 via the upper surface of the semiconductor substrate 101. For example, the PSD 110 may be formed by injecting ions from the upper surface of the semiconductor substrate 101 to a predetermined depth with an energy of about 2 μeV to 3 about μeV. For convenience of an image sensor manufacturing process, for example, the PSD 110 may be first formed in the semiconductor substrate 101, and the conductive well 120 may be formed subsequently above the PSD 110.

A distance d1 may be formed between the PSD 110 and the conductive well 120 along the y-axis. The distance d1 may be measured along the y-axis from a bottom of the conductive well 120, i.e., a surface of the conductive well 120 facing the PSD 110, to a top surface of the PSD 110, i.e., a surface of the PSD 110 facing the conductive well 120. The distance d1 may be about 0.5 μm to about 1 μm. For example, the distance d1 may include a portion of the semiconductor substrate 101, so the conductive well 120 and the PSD 110 may be separated, e.g., completely separated. A space defined between the PSD 110 and the conductive well 120 by the distance d1 may be used as a buffer or the like.

A driving transistor, e.g., the transfer transistor for transmitting charge received from the PSD 110 to the FD region, may be formed adjacent to the conductive well 120 or the PSD 110, e.g., adjacent to a lateral side of the conductive well 120 or of the PSD 110. For example, the transfer transistor, e.g., the charge transmission unit 150, may be formed between the conductive well 120 and the FD region, i.e., the charge detection unit 160.

The charge transmission unit 150 may be formed in a recess region 155 obtained by recessing the semiconductor substrate 101 by a predetermined depth, i.e., along the y-axis, in a form of a recessed gate. In other words, the recess region 155 may be formed by recessing a region adjacent to one side of the conductive well 120 from among the entire region of the semiconductor substrate 101 by a predetermined depth, e.g., to a depth of about 1 μm to about 2 μm from the upper surface of the semiconductor substrate 101. For example, a depth of the recess region 155 along the y-axis may be equal to or larger than a depth of the conductive well 120, so the recess region 155 may overlap the lateral side of the conductive well 120. In another example, a depth of the recess region 155 along the y-axis may be sufficiently large to completely overlap the lateral side of the conductive well 120 and a portion of the PSD 110. For example, the recess region 155 may be positioned between the conductive well 120 and the charge detection unit 160. The recess region 155 of the semiconductor substrate 101 may be formed using substantially the same process of forming the isolation region 140, e.g., by STI or LOCOS.

A gate insulation film 153 may be formed, e.g., conformally, on the recess region 155 of the semiconductor substrate 101. The gate insulation film 153 may be formed of, e.g., one or more of Si oxide and Si nitride. A gate electrode 151 may be formed on the gate insulation film 153 to fill, e.g., completely fill, the recess region 155. The gate electrode 151 may be formed, e.g., of polysilicon. Due to the formation of the charge transmission unit 150 in the shape of a recessed gate, a length of a channel defined below the recessed gate may increase.

The FD region, i.e., the charge detection unit 160, may be formed on one side of the charge transmission unit 150. The charge detection unit 160 may be formed by injecting N+ type impurity ions, e.g., P ions, into the semiconductor substrate 101, e.g., in a direction substantially perpendicular to the upper surface of the semiconductor substrate 101. Thereafter, each of the impurity-injected regions may be activated, and a necessary wiring forming process may be performed according to any suitable method, thereby completing formation of the CIS in which the circuit region and the light receiving region are arranged in a substantially vertical line.

Figure 3:
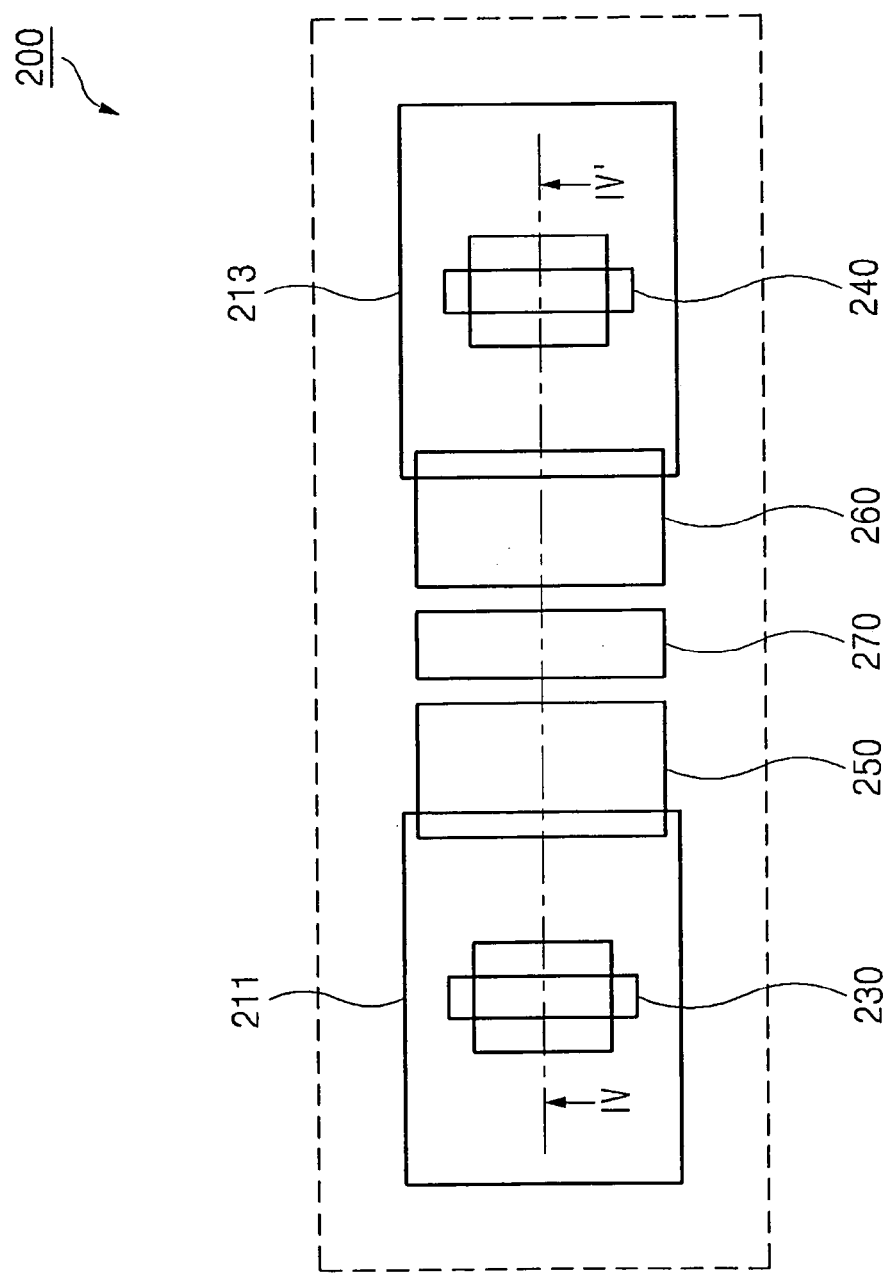
FIG. 3 illustrates a schematic layout of a unit pixel of an image sensor according to another embodiment.
Figure 4:
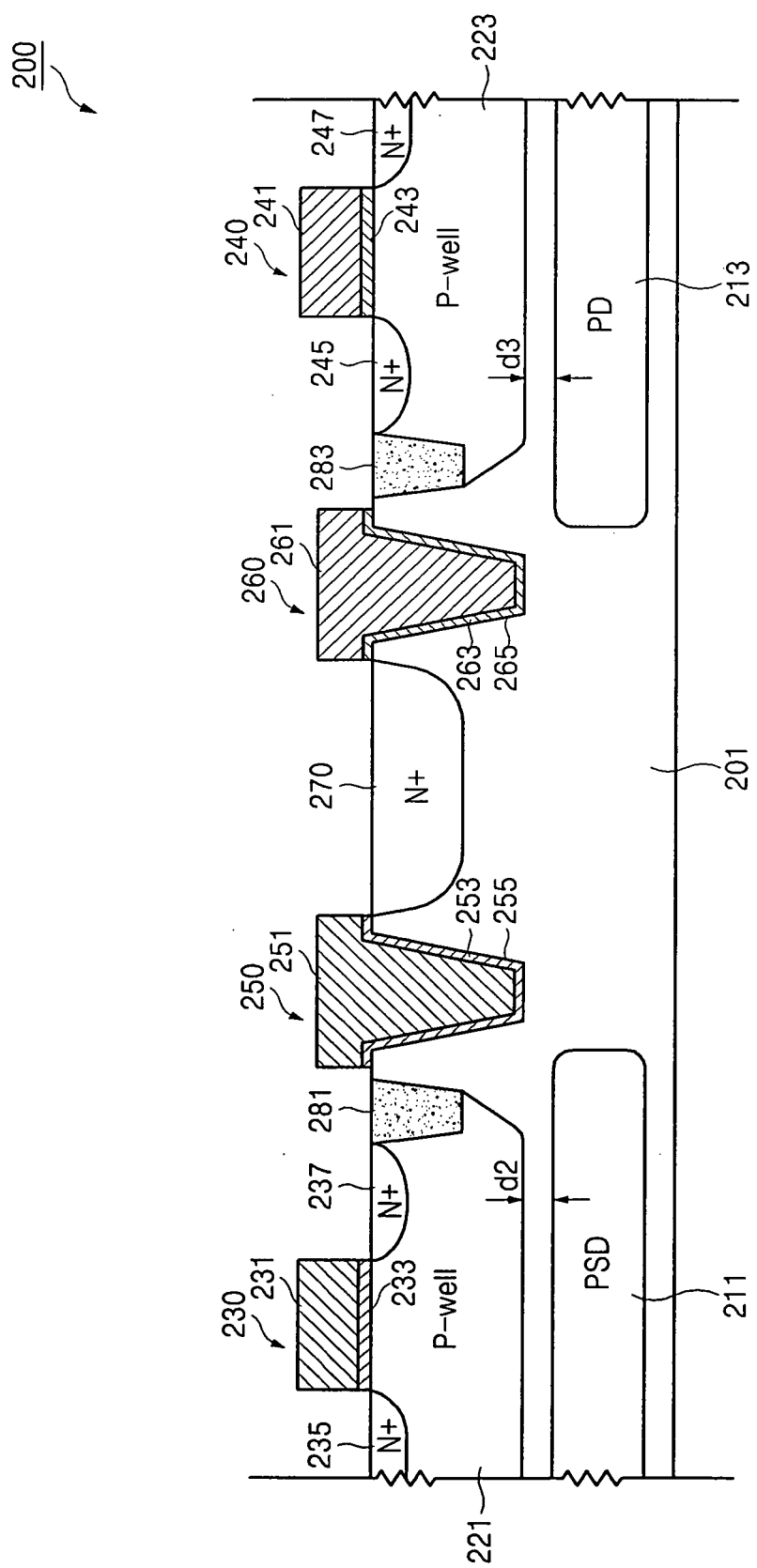
FIG. 4 illustrates a cross-section of the unit pixel in FIG. 3 along line IV~IV' of FIG. 3.

A CIS according to another embodiment will now be described with reference FIGS. 3 and 4. FIG. 3 illustrates a schematic layout of a unit pixel 200 of an image sensor according to another embodiment. FIG. 4 illustrates a cross-section of the unit pixel in FIG. 3 along line IV~IV' of FIG. 3.

Referring to FIGS. 3 and 4, in the unit pixel 200 of the image sensor according to the present embodiment, first and second charge transmission units 250 and 260 and a charge detection unit 270 may be formed between first and second drive transistors 230 and 240. As further illustrated in FIGS. 3 and 4, first and second PSDs 211 and 213 may be formed below the first and second drive transistors 230 and 240, respectively. In other words, in the single unit pixel 200, two circuit regions may be arranged with two respective light receiving regions in vertical lines, and the first and second charge transmission units 250 and 260 and the charge detection unit 270 may be formed between the two vertical lines. Accordingly, the sensitivity of the image sensor may be increased, and saturation electrons may be secured further.

A pair of first and second conductive wells 221 and 223 may be formed in a shallow region of a semiconductor substrate 201 to be separated from each other a predetermined distance. For example, the first conductive well 221 may be formed on a first side of the semiconductor substrate 201, and the second conductive well 223 may be formed on a second side of the semiconductor substrate 201 opposite the first side. The first and second conductive wells 221 and 223 may be formed to have substantially the same depths from an upper surface of the semiconductor substrate 201. The first and second conductive wells 221 and 223 may be P type conductive wells. For example, the first and second conductive wells 221 and 223 and the semiconductor substrate 201 may be substantially the same as the conductive well 120 and semiconductor substrate 101 described previously with reference to FIGS. 1 and 2.

First and second isolation regions 281 and 283 that define active regions may be formed in the first and second conductive wells 221 and 223, respectively. At least one driving transistor, e.g., the first and second drive transistors 230 and 240, may be formed on the first and second conductive wells 221 and 223, respectively. In other words, the first and second drive transistors 230 and 240 may be formed on the upper surface of the semiconductor substrate 201 above the first and second conductive wells 221 and 223, respectively. For example, the first drive transistor 230 including a gate insulation film 233, a gate electrode 231, a source electrode 235, and a drain electrode 237 may be formed on the first conductive well 221. For example, the first and second drive transistors 230 and 240 may be substantially the same as the drive transistor 130 described previously with reference to FIGS. 1 and 2. For example, the first and second isolation regions 281 and 283 may be substantially the same as the isolation region 140 described previously with reference to FIGS. 1 and 2.

The second drive transistor 240 including a gate insulation film 243, a gate electrode 241, a source electrode 245, and a drain electrode 247 may be formed on the second conductive well 223. The first and second drive transistors 230 and 240 may be formed using substantially the same process. Although not shown in FIG. 4, a ground line may be formed in at least one of the first and second conductive wells 221 and 223. The ground lines may prevent charge leaking from the first and second PSDs 211 and 213 from having an electrical influence on the first and/or second conductive well 221 and/or 223.

The first and second PSDs 211 and 213 may be formed in respective light receiving regions, e.g., may define the respective light receiving regions, and may be formed below the first and second conductive wells 221 and 223, respectively. The first PSD 211 may be formed below the first conductive well 221 so as to be separated from each other by a predetermined distance d2, e.g., a distance of about 0.5 µm to about 1 µm. The second PSD 213 may be formed below the second conductive well 223 so as to be separated from each other by a predetermined distance d3, e.g., a distance of about 0.5 µm to about 1 µm. For example, the predetermined distances d2 and d3 may be substantially equal. However, the inventive concept is not limited thereto. For example, structures of the first and second PSDs 211 and 213 relative to respective first and second conductive wells 221 and 223 may be substantially the same as the relative structures of the PSD 110 and the conductive well 120 described previously with reference to FIGS. 1 and 2.

A first transfer transistor, i.e., the first charge transmission unit 250, may be formed adjacent to one side of the first conductive well 221 or one side of the first PSD 211. A second transfer transistor, i.e., the second charge transmission unit 260, may be formed adjacent to one side of the second conductive well 223 or one side of the second PSD 213. The first and second charge transmission units 250 and 260 may be formed to face each other, e.g., overlap each other. The first and second charge transmission units 250 and 260 may transmit charge received from respective first and/or second PSD 211 and/or 213 to an FD region, i.e., the charge detection unit 270.

The first and second charge transmission units 250 and 260 may be formed in recess regions 255 and 265, respectively, obtained by recessing the semiconductor substrate 201 in the form of recessed gates. In other words, the recess regions 255 and 265 may be formed by recessing regions adjacent to one side of the first conductive well 221 and one side of the second conductive well 223 from among the entire region of the semiconductor substrate 201 by a depth of about 1 µm to about 2 µm. The first and second charge transmission units 250 and 260 may be formed on the recess regions 255 and 265 of the semiconductor substrate 201, respectively.

The recess regions 255 and 265 of the semiconductor substrate 201 may be formed, e.g., by STI or LOCOS. Gate insulation films 253 and 263 may be formed on the recess regions 255 and 265, respectively, of the semiconductor substrate 201. Gate electrodes 251 and 261 may be formed on the gate insulation films 253 and 263, respectively, so as to fill the recess regions 255 and 265. The gate electrodes 251 and 261 may be formed of, e.g., polysilicon. For example, the recess regions 255 and 265 may be substantially the same as the recess region 150 described previously with reference to FIGS. 1 and 2. Due to the formation of the first and second charge transmission units 250 and 260 in the shape of recessed gates, the lengths of channels defined below the recessed gates may increase.

The FD region, i.e., the charge detection unit 270, may be formed between the first and second charge transmission units 250 and 260. In other words, the first and second charge transmission units 250 and 260 may share a single FD region, i.e., the single charge detection unit 270. The charge detection unit 270 may be formed by injecting N+ type impurity ions, e.g., P ions, into the semiconductor substrate 201 in a direction substantially perpendicular to the surface of the semiconductor substrate 201. Thereafter, each of the impurity-injected regions may be activated, and a necessary wiring forming process may be performed according to any suitable method, thereby completing the formation of the CIS in which the circuit region and the light receiving region are arranged in a substantially vertical line.

Figure 5:
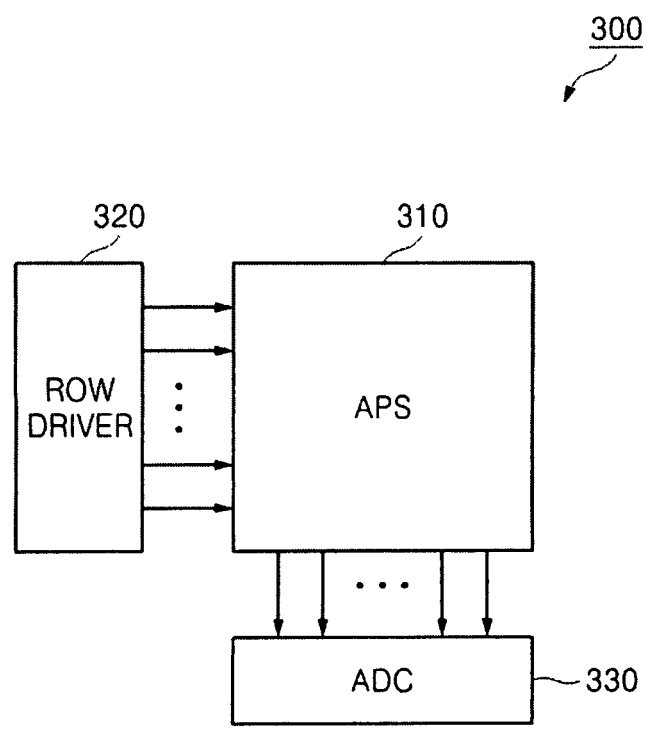
FIG. 5 illustrates a schematic block diagram of a structure of an image sensor according to an embodiment.

FIG. 5 illustrates a schematic block diagram of a structure of an image sensor 300 including any of the unit pixels illustrated in FIGS. 1 through 4 according to an example embodiment. Referring to FIG. 5, the image sensor 300 may include an active pixel sensor (APS) array 310, a row driver 320, and an analog-to-digital converter (ADC) 330.

As described above with reference to FIGS. 1 through 4, the APS array 310 may include a plurality of pixel units 100 and/or 200, i.e., at least one conductive well and at least one PSD arranged in a vertical line in each unit pixel 100 or 200. The APS array 310 may sense light received from a lower surface of a semiconductor substrate by using a PSD, and may convert the sensed light into an electrical signal, thereby generating an image signal. The row driver 320 may drive the APS array 310 in units of rows. For example, the row driver 320 may generate a row selection signal, and the APS array 310 may output to the ADC 330 a reset signal and an image signal from a row selected according to the row selection signal provided by the row driver 320.

The ADC 330 may convert the image signal output from the APS array 310 into a digital signal by using a ramp signal Vramp provided by a ramp signal generator (not shown). For example, the ADC 330 may convert the reset signal and the image signal output from the APS array 310 into a digital signal by performing correlated double sampling on the reset signal and the image signal by using the ramp signal Vramp.

Figure 6:
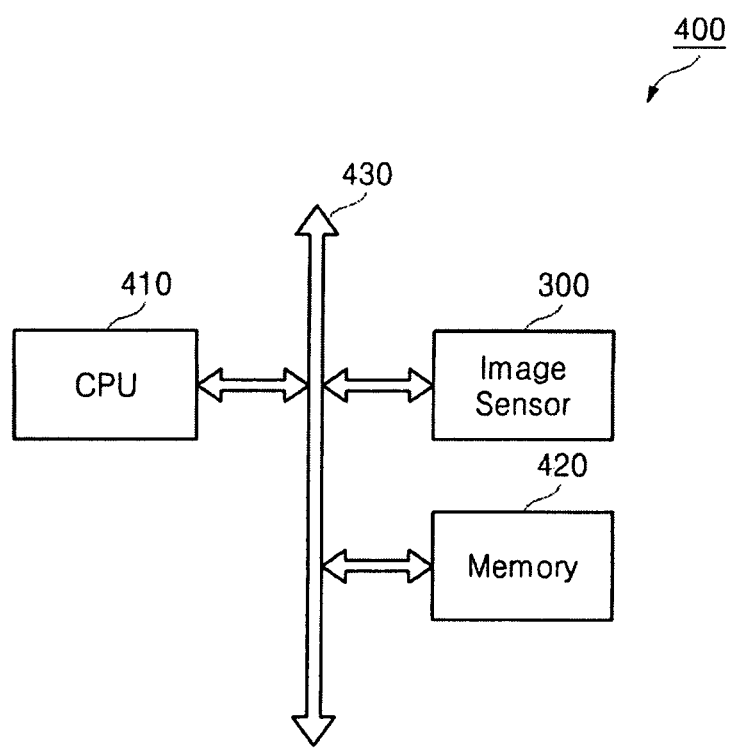
FIG. 6 illustrates a schematic block diagram of an image sensing system including an image sensor according to an embodiment.

FIG. 6 illustrates a schematic block diagram of an image sensing system 400 including the image sensor 300 of FIG. 5 according to an embodiment. The image sensing system 400 may be, e.g., a computer system, a camera system, a scanner, a mechanized clock system, a navigation system, a video phone, a management system, an auto focusing system, an operation-monitoring system, an image stabilization system, or the like, but various other systems may be used as the image sensing system 400. Referring to FIG. 6, the image sensing system 400, e.g., a computer system, may include a bus 430, a central processing unit (CPU) 410, the image sensor 300, and a memory 420.

Although not shown in FIG. 6, the image sensing system 400 may further include an interface (not shown) that is connected to the bus 430 so as to communicate with the outside. The interface may be an input/output (I/O) interface or a wireless interface.

The CPU 410 may generate a control signal for controlling an operation of the image sensor 300, and may provide the control signal to the image sensor 300 via the bus 430. As described above with reference to FIG. 5, the image sensor 300 may include the APS array 310, the row driver 320, and the ADC 330, and may sense light according to the control signal provided from the CPU 410 and convert the light into an electrical signal to generate an image signal. The memory 420 may receive the image signal from the image sensor 300 via the bus 430 and store the image signal. The image sensor 300 may be integrated with the CPU 410, the memory 420, and the like. In some cases, the image sensor 300 may be integrated with a digital signal processor (DSP), or only the image sensor 300 may be integrated into a separate chip.

In an image sensor and an image sensing system including the same according to example embodiments, a PSD may be positioned below a conductive well, so the PSD and conductive well may be aligned along a substantially vertical line. When the PSD is below the conductive well, i.e., when the PSD and the conductive well are at different depth levels relative to an upper surface of a semiconductor substrate with a predetermined space therebetween, the PSD may be designed to have a maximum area regardless of an area of a circuit region of the image sensor, i.e., an area including the conductive well. Accordingly, saturation electrons of the image sensor may be easily secured, and an aperture ratio may be increased. Therefore, an image sensor may have improved sensitivity despite reduced size thereof.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An image sensor, comprising:
    a conductive well in a semiconductor substrate, the conductive well continuously overlapping at least one transistor of a circuit region;
    a photo sensitive device (PSD) in the semiconductor substrate below the conductive well, the PSD and conductive well overlapping each other; and
    a charge transmission unit in the semiconductor substrate and adjacent to the conductive well, the charge transmission unit having a structure of a recessed gate and being positioned in a recess region of the semiconductor substrate, and an entirety of the PSD being below the recess region.

2. The image sensor as claimed in claim 1, further comprising a charge detection unit adjacent to the charge transmission unit, the charge detection unit being adapted to detect a sensing signal received from the PSD via the charge transmission unit.

3. The image sensor as claimed in claim 2, wherein the charge transmission unit is between the charge detection unit and the conductive well, a portion of the semiconductor substrate separating the charge transmission unit and the conductive well along a horizontal direction.

4. The image sensor as claimed in claim 1, wherein the PSD and the conductive well are aligned along a vertical direction, the vertical direction extending along a normal to the semiconductor substrate.

5. The image sensor as claimed in claim 1, wherein the charge transmission unit extends to a predetermined depth in the semiconductor substrate and overlaps a lateral side of the conductive well.

6. The image sensor as claimed in claim 1, wherein the PSD and the conductive well are completely separated from each other by a predetermined distance, the predetermined distance being measured along a direction normal to the semiconductor substrate.

7. The image sensor as claimed in claim 6, wherein the PSD and the conductive well are completely separated from each other by a portion of the semiconductor substrate.

8. The image sensor as claimed in claim 6, wherein the predetermined distance between the PSD and the conductive well is 0.5 µm to 1 µm.

9. The image sensor as claimed in claim 1, further comprising at least one drive transistor on the conductive well, source and drain regions of the drive transistor having conductivity opposite to that of the conductive well, and the conductive well being between the drive transistor and the PSD.

10. The image sensor as claimed in claim 1, further comprising a ground line in the conductive well.

11. The image sensor as claimed in claim 1, wherein:
    the conductive well includes first and second conductive wells in the semiconductor substrate, the first and second conductive wells being spaced apart from each other;
    the PSD includes first and second PSDs below the first and second conductive wells, respectively, each of the first and second PSDs facing a respective one of the first and second conductive wells; and
    the charge transmission unit includes first and second charge transmission units in the semiconductor substrate and adjacent to respective first and second conductive wells, the first and second charge transmission units facing each other.

12. The image sensor as claimed in claim 11, wherein at least one of the first and second charge transmission units has the structure of the recessed gate positioned in the recess region of the semiconductor substrate.

13. The image sensor as claimed in claim 11, wherein the charge detection unit is between the first and second charge transmission units.

14. The image sensor as claimed in claim 11, wherein at least one of the first and second PSDs is spaced apart from a respective first or second conductive well by a predetermined distance, the predetermined distance being measured along a direction normal to the semiconductor substrate.

15. The image sensor as claimed in claim 14, wherein the predetermined distance is 0.5 µm to 1 µm.

16. The image sensor as claimed in claim 11, further comprising at least one ground line in each of the first and second conductive wells.

17. The image sensor as claimed in claim 1, wherein the conductive well includes two layers, each layer including a different concentration of a p-type impurity.

18. An image sensing system, comprising: an image sensor including an active pixel sensor (APS) array and an analog-to-digital converter (ADC), the APS array being adapted to sense light and generate an image signal, and the ADC being adapted to sample the image signal and convert the image signal into a digital signal;
  a central processing unit (CPU) adapted to control an operation of the image sensor; and a memory adapted to store the image signal generated by the image sensor, wherein a unit pixel of the APS array includes:
  a conductive well in a semiconductor substrate, the conductive well continuously overlapping at least one entire transistor of a circuit region;
  a photo sensitive device (PSD) in the semiconductor substrate below the conductive well, the PSD and conductive well overlapping each other;
  a charge transmission unit in the semiconductor substrate and adjacent to the conductive well, the charge transmission unit having a structure of a recessed gate and being positioned in a recess region of the semiconductor substrate, and an entirety of the PSD being below the recess region.

19. The image sensing system as claimed in claim 17, wherein:
  the conductive well includes first and second conductive wells in the semiconductor substrate, the first and second conductive wells being spaced apart from each other;
  the PSD includes first and second PSDs below the first and second conductive wells, respectively, each of the first and second PSDs facing a respective one of the first and second conductive wells; and
  the charge transmission unit includes first and second charge transmission units in the semiconductor substrate and adjacent to respective first and second conductive wells, the first and second charge transmission units facing each other.

20. An image sensor, comprising:
  a conductive well in a semiconductor substrate, the conductive well continuously overlapping at least one transistor of a circuit region, and a source region and a drain region of the at least one transistor being in the conductive well;
  a photo sensitive device (PSD) in the semiconductor substrate below the conductive well, the PSD and conductive well overlapping each other, an entirety of the PSD being below the conductive well; and
  a charge transmission unit in the semiconductor substrate and adjacent to the conductive well, the charge transmission unit having a structure of a recessed gate and being positioned in a recess region of the semiconductor substrate.

* * * * *

UNITED STATES PATENT AND TRADEMARK OFFICE
CERTIFICATE OF CORRECTION

PATENT NO. : 8,451,362 B2
APPLICATION NO. : 12/461608
DATED : May 28, 2013
INVENTOR(S) : Yong Jei Lee et al.

Page 1 of 1

It is certified that error appears in the above-identified patent and that said Letters Patent is hereby corrected as shown below:

In the Claims:

Column 10, lines 49-51:

"13. The image sensor as claimed in claim 11, wherein the charge detection unit is between the first and second charge transmission units."

should read:

-- 13. The image sensor as claimed in claim 11, further comprising a charge detection unit between the first and second charge transmission units. --

Signed and Sealed this
Second Day of July, 2013

Teresa Stanek Rea
*Acting Director of the United States Patent and Trademark Office*